United States Patent
Peine

(10) Patent No.: US 6,820,349 B2
(45) Date of Patent: Nov. 23, 2004

(54) END EFFECTOR ALIGNMENT TOOL FOR SUBSTRATE HANDLING SYSTEM

(75) Inventor: Michael H. Peine, Maple Grove, MN (US)

(73) Assignee: August Technology Corp., Bloomington, MN (US)

( * ) Notice: Subject to any disclaimer, the term of this patent is extended or adjusted under 35 U.S.C. 154(b) by 0 days.

(21) Appl. No.: 10/262,479

(22) Filed: Sep. 30, 2002

(65) Prior Publication Data

US 2004/0060187 A1 Apr. 1, 2004

(51) Int. Cl.[7] .............................................. G01D 21/00
(52) U.S. Cl. ......................................... 33/645; 33/613
(58) Field of Search .................. 33/645, 613, 262–263, 33/286, 501.08, 201, 562–563, 567, 572

(56) References Cited

U.S. PATENT DOCUMENTS

| | | | | |
|---|---|---|---|---|
| 3,846,918 A | * | 11/1974 | Wehlau | 33/262 |
| 4,295,276 A | * | 10/1981 | Ellington, III | 33/644 |
| 5,425,846 A | * | 6/1995 | Koze et al. | 438/492 |
| 5,783,097 A | * | 7/1998 | Lo et al. | 216/41 |
| 6,094,965 A | * | 8/2000 | Hubbard et al. | 33/562 |
| 6,412,326 B1 | * | 7/2002 | Hubbard et al. | 73/1.01 |

* cited by examiner

Primary Examiner—Diego Gutierrez
Assistant Examiner—Tania Courson
(74) Attorney, Agent, or Firm—Dicke, Billig & Czaja, PLLC

(57) ABSTRACT

An end effector alignment tool for properly aligning the end effector arm with a prealigner and separately with a top plate.

20 Claims, 4 Drawing Sheets

END EFFECTOR ALIGNMENT TOOL FOR SUBSTRATE HANDLING SYSTEM

BACKGROUND OF THE INVENTION

1. Technical Field

The present invention relates to substrate handling systems having end effector arms where the systems are used in the semiconductor industry such as those used in conjunction with defect inspection systems. More particularly, the present invention is an end effector alignment tool for properly aligning the end effector arm with a prealigner and separately with a top plate.

2. Background Information

Over the past several decades, the semiconductor has exponentially grown in use and popularity. The semiconductor has in effect revolutionized society by introducing computers, electronic advances, and generally revolutionizing many previously difficult, expensive and/or time consuming mechanical processes into simplistic and quick electronic processes. This boom in semiconductors has been fueled by an insatiable desire by business and individuals for computers and electronics, and more particularly, faster, more advanced computers and electronics whether it be on an assembly line, on test equipment in a lab, on the personal computer at one's desk, or in the home electronics and toys.

The manufacturers of semiconductors have made vast improvements in end product quality, speed and performance as well as in manufacturing process quality, speed and performance. However, there continues to be demand for faster, more reliable and higher performing semiconductors.

One process that has evolved over the past decade or so is the semiconductor inspection process. The merit in inspecting semiconductors throughout the manufacturing process is obvious in that bad wafers may be removed at the various steps rather than processed to completion only to find out a defect exists either by end inspection or by failure during use.

It is necessary to provide wafers to the inspection system, or other systems or processes in the manufacture, inspection, packaging, etc. of wafers. End effector arms are used to move wafers. It is thus desirable to align such end effector arms with the various devices the end effector must function in unison with such as prealigners and top plates.

SUMMARY OF THE INVENTION

The present invention is an end effector alignment tool for properly aligning the end effector arm with a prealigner and separately with a top plate.

BRIEF DESCRIPTION OF THE DRAWINGS

Preferred embodiment of the invention, illustrative of the best mode in which applicant has contemplated applying the principles, are set forth in the following description and are shown in the drawings and are particularly and distinctly pointed out and set forth in the appended claims.

DETAILED DESCRIPTION OF THE PREFERRED EMBODIMENT

Figure 1:
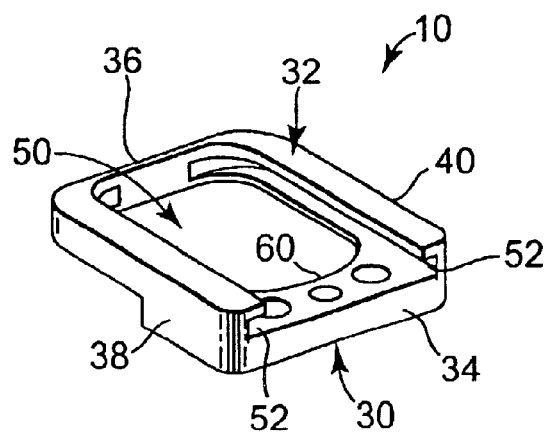
FIG. 1 is a perspective drawing of the front of the end effector alignment tool of the present invention.
Figure 2:
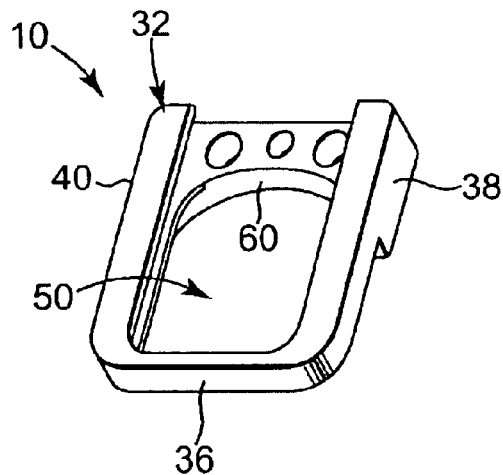
FIG. 2 is a perspective drawing of the back of the end effector alignment tool of FIG. 1.
Figure 3:
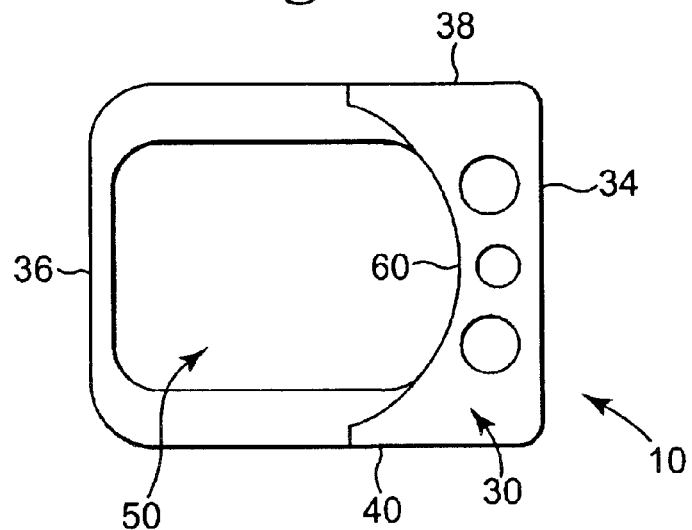
FIG. 3 is a top view of the alignment tool of FIG. 1.
Figure 4:
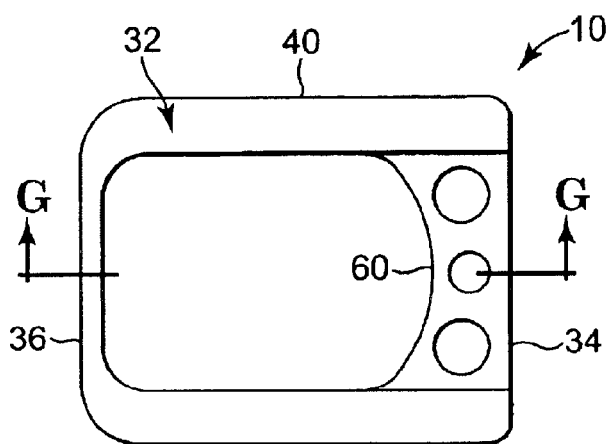
FIG. 4 is a bottom view of the alignment tool of FIG. 1.
Figure 5:
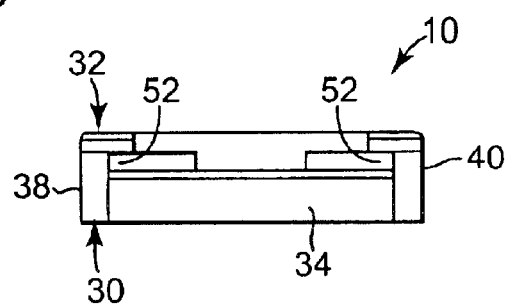
FIG. 5 is an end view of the alignment tool of FIG. 1.
Figure 8:
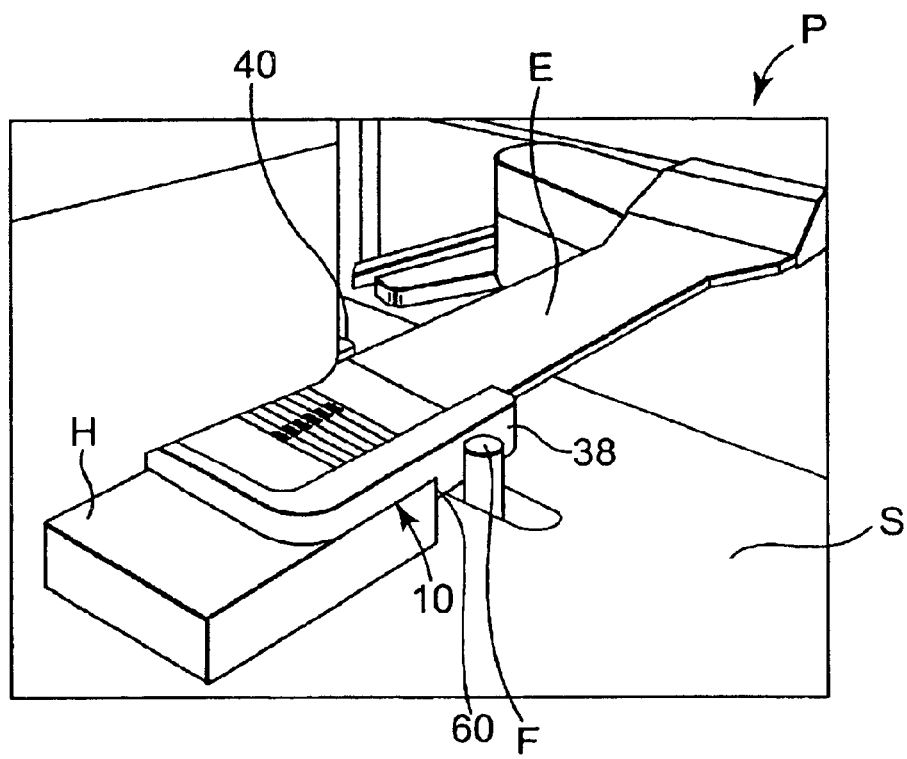
FIG. 8 illustrates the alignment tool of FIGS. 1–7 positioned on an end effector and in an environment of an aligner where it is centered on the aligner chuck.
Figure 9:
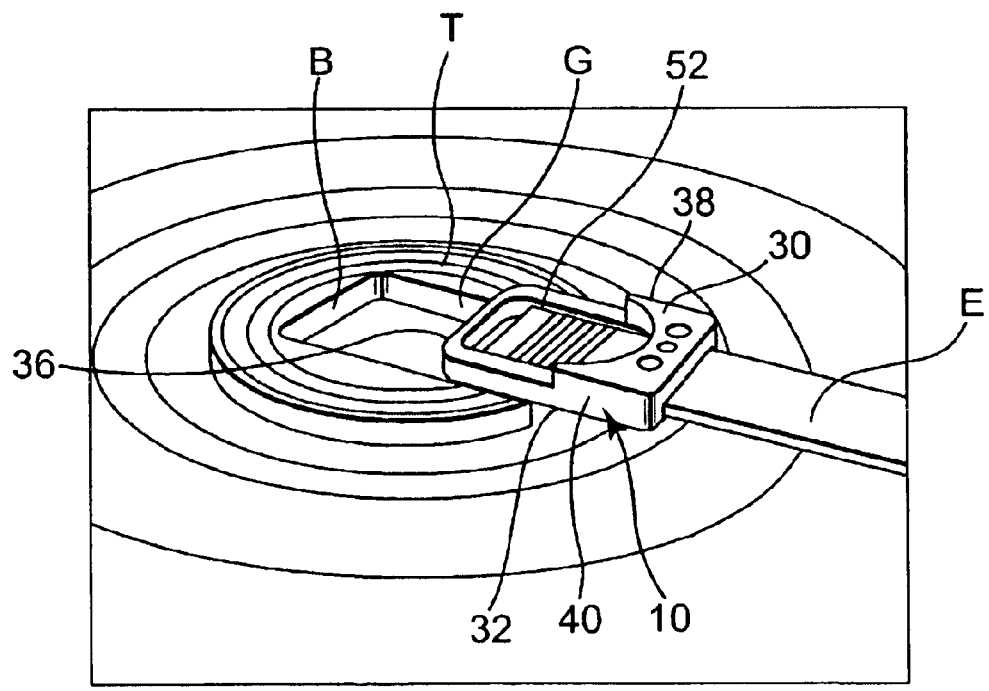
FIG. 9 illustrates the alignment tool of FIGS. 1–7 positioned on an end effector and in an environment of an inspection top plate where it is entering an end effector receiving notch within a surface for receiving a wafer.
Figure 10:
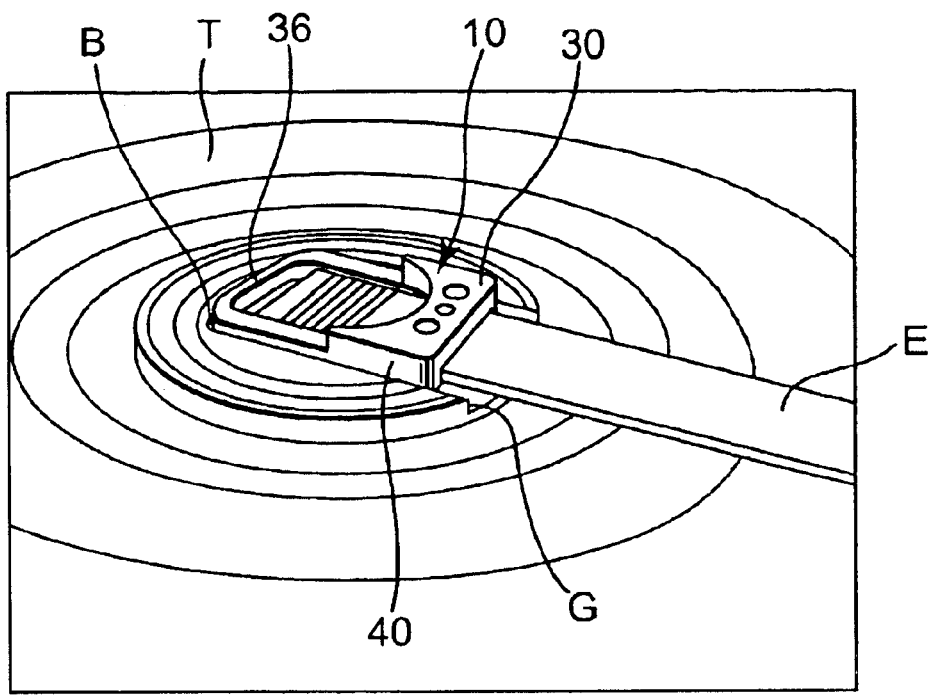
FIG. 10 illustrates the alignment tool of FIGS. 1–7 positioned on an end effector and in an environment of an inspection top plate where it is fully seated in the end effector receiving notch within the surface for receiving a wafer.
Figure 11:
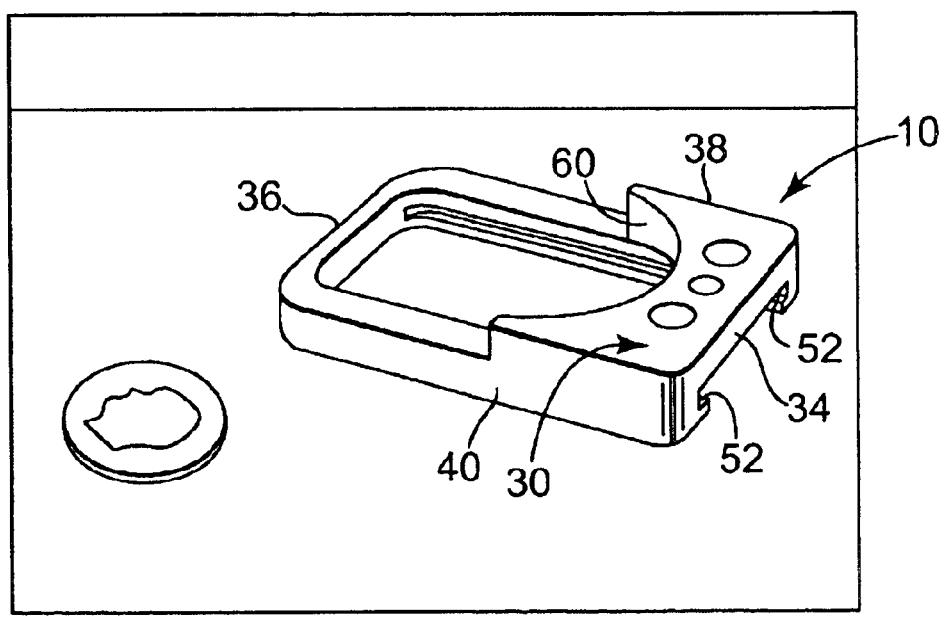
FIG. 11 is a perspective view of the alignment tool of FIGS. 1–10.

The end effector alignment tool of the present invention is indicated generally at 10 as is best shown overall in FIGS. 1, 2 and 11, and is used in two distinct environments as shown in FIGS. 8, and 9–10. The end effector alignment tool 10 is designed and constructed to slip over an end effector arm as shown in FIGS. 8–10. Once the end effector alignment tool 10 is positioned over the end effector arm (end effector E), it provides for exact alignment and proper positioning of the arm on a prealigner P or aligner via centering on an aligner chuck, or a top plate T of an inspection station.

The end effector alignment tool 10 includes a first main face 30 and a second main face 32 that are generally opposite one another and separated by a plurality of side faces including open end face 34, closed end face 36 opposite to the open end face, and a pair of side faces 38 and 40. A large center hole 50 extends between the faces 30 and 32. In addition, a slot 52 is defined in the tool 10 extending inward from open end face 34 whereby the slot is configured to receive an end effector E such that the tool envelopes the end of the end effector as is shown in FIGS. 8–10 (whether the first main face is positioned to receive a hub H as in FIG. 8 or the second main face is positioned to slide within a slot or groove G as shown in FIGS. 9–10).

As described above, the slot 52 is defined to receive an end effector. The first and second main faces 30 and 32 are correspondingly defined to interact with either an aligner chuck or hub H on a prealigner or aligner in the case of the first main face 30, or a top plate T and its end effector receiving slot or groove G in the case of the second main face 32. This allows for optimal usage of the tool.

The first main face 30 is defined to receive the aligner hub H on a prealigner P or aligner as is best shown in FIG. 8. A prealigner P or aligner is a substantially flat or planar plate or stage S on which wafers or the like are placed on the aligner chuck or hub H, and rotated or spun to see if the center axis is aligned with the aligner hub H. If not centered, then iteratively moved toward such alignment of the wafer center with the hub center, and rotated or spun again until the iterative process centers the wafer. The result is a prealigned or aligned wafer such that the wafer is then returned to its cassette pre-aligned or moved by the end effector E to the next process step in an aligned orientation.

The chuck or hub is typically round and rotates. It is often referred to as a puck, or a round rotating hub. In addition, the prealigner plate or stage includes a plurality of retractable pins or fingers F. The fingers F extend upward out of the stage S. These pins receive the wafer when the end effector arm slides over the stage and then drops itself (moves closer to the stage). The end effector may then be withdrawn as it has set the wafer onto the prealigner and is no longer holding the wafer. The pins will then retract allowing the wafer to seat on the hub H where it will be rotated or spun. This determines the offset of the wafer to the hub, whereby the pins extend outward again and the end effector arm returns to slightly move the wafer before both retract and leave the wafer on the hub again in a slightly different position (closer to center). The hub rotates and the offset is determined, and followed by the pins extending and then end effector returning to move the wafer again. This iterative process is repeated until the wafer is precisely centered. This process is well known in the art.

Figure 6:
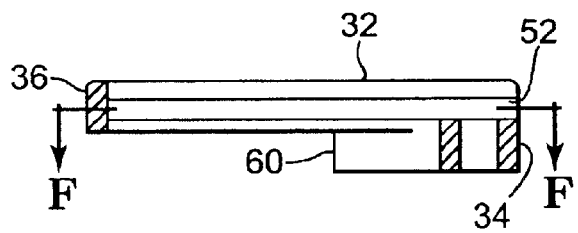
FIG. 6 is a section view taken along lines G—G in FIG. 4.
Figure 7:
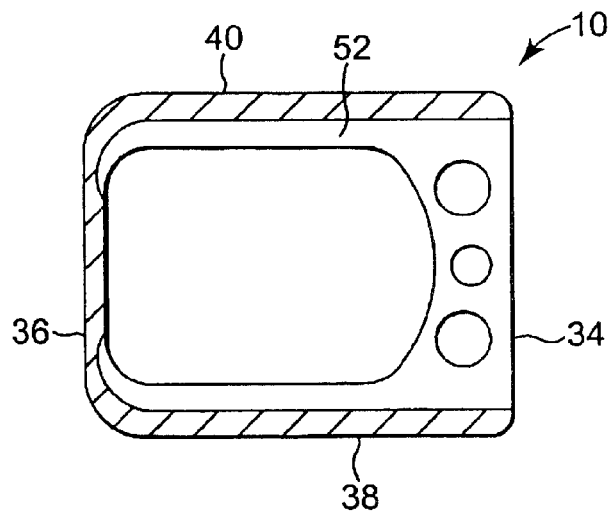
FIG. 7 is a section view taken along lines F—F in FIG. 6.

The first main face 30 specifically includes a curved back face 60 contoured to rest against the hub H. This face extends away from or outward as is shown in FIG. 6 thus allowing the face 60 to serve a stop. Furthermore, the closed end face 36 opposite to the open end face, and the pair of side faces 38 and 40 are configured and positioned to rest snuggly against the pins as is shown in FIG. 8. As a result, the end effector tool 10 is sized to snuggly fit between opposing fingers F (one shown).

When the end effector tool 10 is positioned over the end effector E such that the end effector is seated within the slot 52, and the curved back face 60 is facing downward (toward the prealigner P), the end effector tool 10 is positioned to properly align the end effector E with the hub H. This is accomplished by moving the end effector E with tool 10 thereon slowly between the fingers F and at such a height from stage S that curved back face 60 gently engages with or saddles hub H. The end effector E is now precisely aligned with the hub H and such positioning may be programmed into the computer controlling the end effector E.

The second main face 32 is configured and sized to snugly fit within an end effector receiving slot or groove G in a top plate T as is best shown in sequence in FIGS. 9 and 10. The closed end face 36 functions as a stop where it seats in the base or back end B of the groove G, while the side faces 38 and 40 are separated by a distance corresponding to the width of the groove G.

Top plates for inspecting and other semiconductor and electronic manufacturing are used to receive wafers or the like whereby the wafer eventually seats, rests, or is otherwise positioned on the top plate for processing such as inspection. These top plates often include vacuum ports to suction or hold down the wafer. These top plates further typically include an end effector receiving slot or groove G that allows the end effector E to move over the plate T, set the wafer down on the plate and then retract away from the plate. The process of setting the wafer down and retracting requires that the groove or slot G be present in which the end effector may move without disturbing the wafer. In FIGS. 9 and 10, this groove is shown.

To teach centering of the end effector E on the top plate T, the end effector tool 10 is slid over the end effector arm E such that the end effector is fully seated in the slot 52 with the second main face 32 facing the top plate T as is shown in the FIGS. 9 and 10. The end effector E with the tool 10 thereon is moved over the plate T and into the groove or slot G where the end effector tool 10 snugly fits in the groove G. The end effector E slides completely into the groove G until the closed end face 36 seats against the back end B of the groove G. The end effector is now precisely positioned within the groove G and on the top plate T to accurately position a wafer thereon.

Accordingly, the invention as described above and understood by one of skill in the art is simplified, provides an effective, safe, inexpensive, and efficient device, system and process which achieves all the enumerated objectives, provides for eliminating difficulties encountered with prior devices, systems and processes, and solves problems and obtains new results in the art.

In the foregoing description, certain terms have been used for brevity, clearness and understanding; but no unnecessary limitations are to be implied therefrom beyond the requirement of the prior art, because such terms are used for descriptive purposes and are intended to be broadly construed.

Moreover, the invention's description and illustration is by way of example, and the invention's scope is not limited to the exact details shown or described.

Having now described the features, discoveries and principles of the invention, the manner in which it is constructed and used, the characteristics of the construction, and the advantageous, new and useful results obtained; the new and useful structures, devices, elements, arrangements, parts and combinations, are set forth in the appended claims.

What is claimed is:

1. An end effector alignment tool for a substrate handling system, the alignment tool comprising:
   a body defining:
      an outer perimeter,
      an interior edge spaced from the outer perimeter, and
      at least one slot formed in the interior edge and extending to the outer perimeter at an open end;
   wherein the open end opposes a closed end, the ends extending between opposing faces, the open end adapted to couple to an end effector and the closed end configured to orient the end effector relative to a top plate of the substrate handling system.

2. The alignment tool of claim 1, wherein the body further includes:
   a first side opposing a second side, the sides extending between the open end and the closed end.

3. The alignment tool of claim 2, wherein a first slot is formed in the interior edge adjacent the first side and a second slot is formed in the interior edge adjacent the second side, the slots configured to receive the end effector.

4. The alignment tool of claim 1, wherein the body further includes:
   a leading portion terminating at the closed end, a trailing portion terminating at the open end, and further wherein the trailing portion has a thickness greater than a thickness of the leading portion, the trailing portion defining a curved stop.

5. The alignment tool of claim 4, wherein the opposing faces include a first main face and a second main face, the curved stop formed in the first main face adjacent the closed end.

6. The alignment tool of claim 4, wherein the curved stop defines a semi-circle.

7. The alignment tool of claim 4, the first main face is configured to receive an aligner chuck on a prealigner of the substrate handling system.

8. The alignment tool of claim 4, wherein the second main face is sized to frictionally fit within a groove of a top plate of the substrate handling system.

9. The alignment tool of claim 1, wherein the body further defines a relief hole extending between the opposing faces, the relief hole bounded by the interior edge.

10. The alignment tool of claim 1, wherein the interior edge is non-uniformly spaced from the outer perimeter.

11. The alignment tool of claim 1, wherein the interior edge defines a non-uniform radius of curvature.

12. A method of positioning an end effector relative to a substrate handling system, the method comprising:
   providing an end effector alignment tool, the alignment tool including a body defining an outer perimeter, the body including:
      an open end opposite a closed end, the ends extending between opposing first and second faces,
      an interior edge spaced from the outer perimeter,
      a first side opposing a second side, the sides extending between the open end and the closed end,
      a first slot formed in the interior edge adjacent the first side,
      a second slot formed in the interior edge adjacent the second side,
      a curved stop formed in the interior edge adjacent the open end;
   seating the end effector within the slots of the alignment tool; and
   aligning the alignment tool with the handling system;
   wherein aligning the alignment tool identifies a reference orientation for the end effector relative to the substrate handling system enabling the end effector to subsequently move and return to the reference orientation.

13. The method of claim 12, wherein aligning the alignment tool includes aligning the alignment tool with a hub on a prealigner.

14. The method of claim 13, wherein aligning the alignment tool with a hub includes positioning the alignment tool between retractable fingers projecting from a prealigner.

15. The method of claim 13, wherein aligning the alignment tool with a hub includes saddling the curved stop about a hub of a prealigner.

16. The method of claim 12, wherein aligning the alignment tool includes aligning the alignment tool with a top plate of the handling system.

17. The method of claim 16, wherein aligning the alignment tool with a top plate includes mating the second face within a groove in a top plate of the handling system.

18. The method of claim 17, wherein mating the second face within a groove in a top plate includes stopping the closed end of the alignment tool against a back of a groove formed in the top plate.

19. The method of claim 12, further comprising programming a controller of the end effector with coordinates defining a reference orientation of the end effector.

20. An end effector alignment tool for a substrate handling system, the alignment tool comprising:
   a body defining:
      an outer perimeter,
      an interior edge spaced from the outer perimeter;
   means for coupling the body to an end effector of the substrate handling system;
   means for orienting the end effector relative to a top plate of the substrate handling system; and
   means for orienting the end effector relative to a hub of a prealigner of the substrate handling system.

* * * * *